(12) United States Patent
Mohindra

(10) Patent No.: US 6,442,380 B1
(45) Date of Patent: Aug. 27, 2002

(54) AUTOMATIC GAIN CONTROL IN A ZERO INTERMEDIATE FREQUENCY RADIO DEVICE

(75) Inventor: Rishi Mohindra, Milpitas, CA (US)

(73) Assignee: U.S. Philips Corporation, Tarrytown, NY (US)

( * ) Notice: Subject to any disclaimer, the term of this patent is extended or adjusted under 35 U.S.C. 154(b) by 0 days.

(21) Appl. No.: 09/469,880

(22) Filed: Dec. 22, 1999

(51) Int. Cl.[7] .................................................. H04B 1/06

(52) U.S. Cl. ............................... 455/234.11; 455/250.1

(58) Field of Search ........................... 455/234.1, 234.2, 455/241.1, 245.1, 239.1, 250.1, 254, 324; 330/129, 279; 375/345

(56) References Cited

U.S. PATENT DOCUMENTS

| | | | | |
|---|---|---|---|---|
| 5,805,979 A | * | 9/1998 | Miyashita | 455/234.1 |
| 5,982,235 A | | 11/1999 | Kinomura | 330/279 |
| 5,982,807 A | | 11/1999 | Snell | 375/200 |
| 6,242,982 B1 | * | 6/2001 | Ibelings et al. | 455/234.1 |

OTHER PUBLICATIONS

By Lawrence W. Larson, RF and Microwave Circuit Design For Wireless Communications, L.E. Larson, Artech House Publ., 1996, p. 73.
Draft Suppl., Part II, IEEE 802. 1 1B Std., 1997, p. 62.

* cited by examiner

Primary Examiner—Thanh Cong Le
(74) Attorney, Agent, or Firm—Theo Mak

(57) ABSTRACT

A zero intermediate frequency radio device has an antenna for receiving a radio frequency signal, and a frequency down converter for down converting the received radio frequency signal to a zero intermediate frequency signal. The radio device further has controllable amplifier stages, controllable AC-coupling stages, controllable filter stages, and a received signal strength indicator. A signal resolving range of the received signal strength indicator is below a high dynamic range of the received radio frequency signal. The radio device further has an automatic gain controller. The automatic gain controller initially sets the gain of the Rx path of the radio device to a maximum of minimum gain, and then waits for DC-offsets in the Rx path to cancel. If, at maximum or minimum gain, a reading of the received signal strength indicator is within a particular range, the automatic gain controller sets the gain to the reading. Then, automatic gain control settles. If this is not the case, the gain of the Rx path is stepwise decreased or increased, while repeating the DC-offset cancellation step of waiting for the DC-offset to cancel, until the reading of the received signal strength indicator falls in the signal resolving range around the then set gain of the Rx path.

14 Claims, 3 Drawing Sheets

AUTOMATIC GAIN CONTROL IN A ZERO INTERMEDIATE FREQUENCY RADIO DEVICE

BACKGROUND OF THE INVENTION

1. Field of the Invention

The present invention relates to automatic gain control in a zero intermediate frequency radio device such as a receiver or transceiver. Such a radio device processes down-converted and demodulated received radio frequency signals, and, when a transmit part is also present, transmits modulated and up-converted signals. Such radio devices can be cellular radio, cordless telephony, or, wireless local area network radio devices, satellite radio devices, or any other suitable radio device.

2. Description of the Related Art

From the handbook "RF and Microwave Circuit Design for Wireless Communications", L. E. Larson, Artech House Publishers, 1996, page 73, a Direct-Conversion zero-IF receiver is known. In such a receiver, a local oscillator comprised in the receiver is tuned to a carrier frequency of the incoming radio frequency signal. When DC-coupling stages in such a direct conversion zero-IF receiver, serious problems are caused by DC-offset such as due to LO-leakage to an input of a low noise radio frequency amplifier that is usually present between an antenna and a mixer of the zero-IF radio device, and further due to DC-offset in various components of the radio device, such as in channel filters, amplifiers, or in other components. To mitigate such DC-offset problems, AC-coupling is provided in the receive branch of the radio device. Such an AC-coupling can be distributed over various stages whereby all stages are designed such that the DC-offset of a stage is much smaller than the dynamic range of that stage.

In the U.S. Pat. No. 5,982,807, an intermediate frequency spread spectrum radio transceiver is disclosed for use in wireless local area network, in the so-called 2.4 GHz ISM band as defined in the IEEE 802.11b standard. In the transceiver, a baseband processor comprises a demodulator for spread spectrum phase shift keying (PSK) demodulating information received from a radio circuit comprised in the transceiver. In addition to a bi-phase or binary PSK mode (BPSK), the transceiver can operate in a quadrature PSK mode (QPSK). The demodulator is connected to an output of an analog-to-digital converter. The analog-to-digital converter is AC-coupled to the radio circuit. For substantially reducing an average DC-component, a particular type of Walsh code is used. As shown in FIG. 1 of U.S. Pat. No. 5,982,807, the wireless transceiver has an antenna, an up/down converter, and a Tx/Rx-switch. The up/down converter is connected to a low noise radio frequency amplifier in a receive branch of the transceiver, and to a radio frequency power amplifier in a transmit branch of the transceiver. The up/down converter is connected to a frequency synthesizer and to an IF modulator/demodulator. The transceiver further comprises various filters, and voltage controlled oscillator. A baseband processor comprise high speed 3-bit analog to digital converters for receiving the quadrature I and Q signals from the modulator/demodulator. Furthermore, the baseband processor includes a received signal strength indicator monitoring function with a 6-bit analog to digital converter.

On page 62 of the DRAFT Supplement, Part 11, to the above IEEE 802.11b standard, operating channels are shown for North American Channel Selection. With a local oscillator in the radio tuned to 2412 MHz, the zero-IF radio device receives radio signals from the shown non-overlapping Channel 1.

In the U.S. Pat. No. 5,982,235, an automatic gain control circuit (AGC) is disclosed which is used for mobile communication. As shown in FIG. 7 of U.S. Pat. No. 5,982,235, the gain of an amplifier is set. The amplifier that amplifies an input IF signal, has a gain control function. The thus-amplified signal is output to a demodulation circuit. For application of an AGC in mobile communication, as described, a receiving level changes as great as +10 dB or more to −30 dB or less. In order to take care of a significant drop in the receiving level in excess of the range of control of the AGC, such as due to a fading phenomenon, the shown automatic gain control circuit comprises a fading detection circuit at IF (RSSI), an AGC convergence level setting circuit, a signal-to-noise (S/N) detection circuit, and an AGC setting circuit. The S/N detection circuit that is connected to an output of the amplifier provides one input signal to the AGC convergence level setting circuit. The RSSI provides another input signal to the AGC convergence level setting circuit. The AGC circuit further comprises an attenuation setting circuit coupled to an output of the amplifier. The output signal of the AGC circuit occurs at an output of the attenuation setting circuit. The RSSI detects whether the AGC circuit is on the move at high speed. If this is the case, the AGC convergence level setting circuit controls the AGC convergence level so as to increase or decrease, thereby preventing loss of data. If this is not the case, the ratio of an output signal to noise and the output signal level are maintained at constant levels. If a fading occurs, the level of AGC convergence is increased thereby preventing deterioration of the ratio of the output signal to noise. The attenuation circuit is set such that the level of the output signal remains constant.

SUMMARY OF THE INVENTION

It is an object of the invention to provide an automatic gain controller in a zero intermediate frequency radio device with AC-coupled stages, whereby a signal resolving range of a received signal strength indicator is below a high dynamic range exhibited by an incoming radio frequency signal.

It is another object of the invention to provide such an automatic gain controller that stepwise iterates to providing an output signal to be sampled in a linear range of the received signal strength indicator, either by initially starting with a maximum gain or with a minimum gain.

It is still another object of the invention to provide such an automatic gain controller that first kicks off by modifying the gain of the low noise radio frequency amplifier (LNA) where the largest DC-offset problems exist and where the effect of out-of-band jammers can be reduced by decreasing the gain of the LNA.

It is still another object of the invention to reduce the negative effects of AC-coupling after the AGC has settled, by reducing the cut-off frequency of the AC-coupling.

It is still another object of the invention to distribute gain control over components of the receive branch between the antenna and the signal processor for processing the zero-IF signal.

In accordance with the invention, a zero intermediate frequency radio device is provided comprising:

an antenna for receiving a radio frequency signal, said radio frequency signal exhibiting a high dynamic range;

a frequency down converter for down converting said radio frequency signal to a zero intermediate frequency signal, said frequency down converter comprising a mixer, an AC-coupler, and a received signal strength indicator with a signal resolving range that is below said high dynamic range, said AC-coupler being coupled to an output of said mixer;

a signal processor for processing said zero intermediate frequency signal;

at least one amplifier coupled between said antenna and said signal processor; and an automatic gain controller for at least gain controlling said at least one amplifier, said automatic gain controller being configured to set a gain of said at least one amplifier by setting said gain to a predetermined gain, by waiting a predetermined time for allowing DC-offset signals in said radio device to decay, by checking whether a reading of said received signal strength indicator is within said signal resolving range, and by setting said gain in accordance with said reading if said reading is within said signal resolving range.

The invention is based upon the insight that in zero intermediate frequency radio device with AC-couplers, the AGC can only be set if no signal saturation at the output of the RSSI occurs, due to DC offsets.

BRIEF DESCRIPTION OF THE DRAWING

Throughout the figures the same reference numerals are used for the same features.

DESCRIPTION OF THE PREFERRED EMBODIMENT

Figure 1:
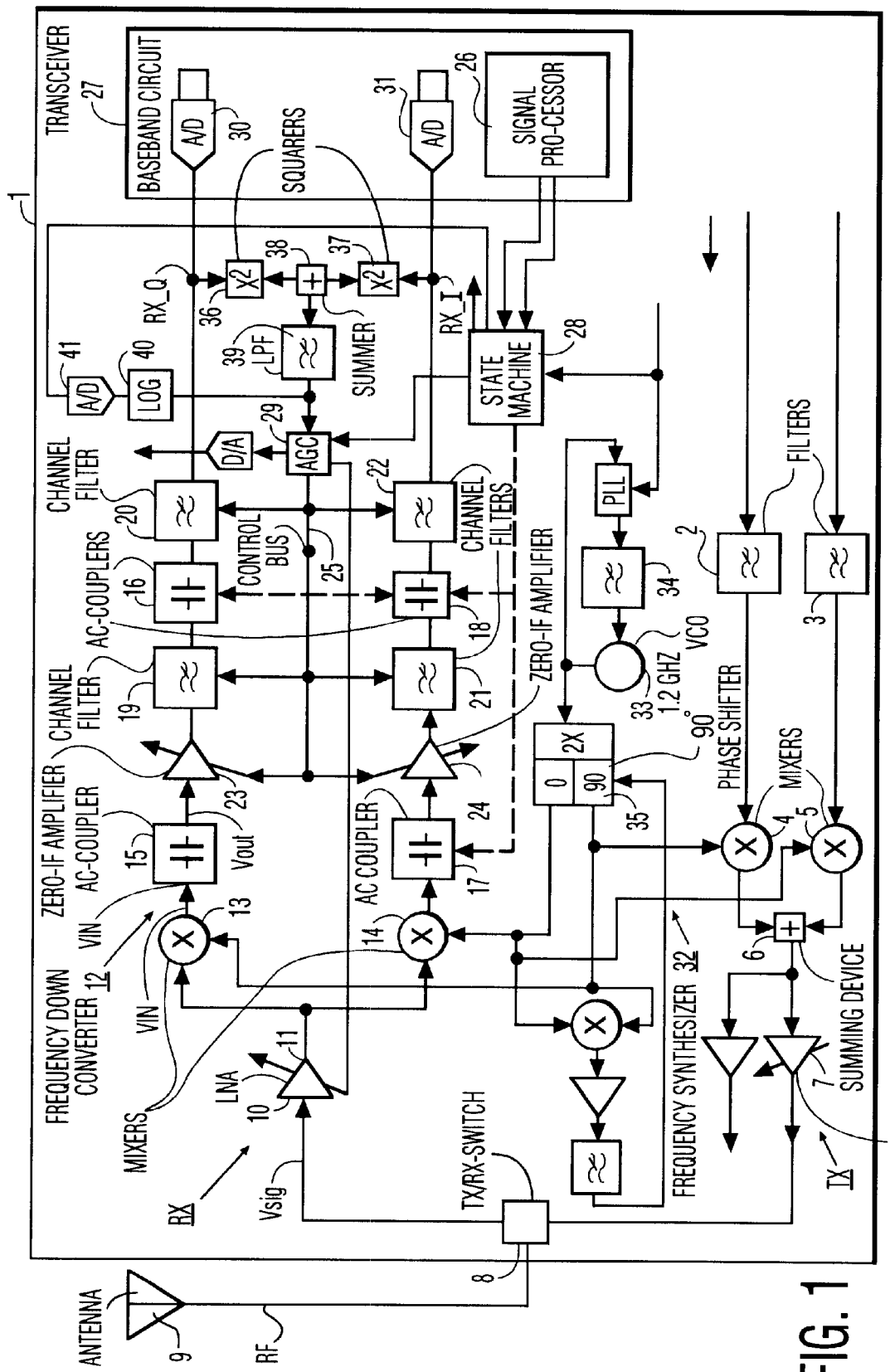
FIG. 1 shows a block diagram of a zero intermediate frequency radio device according to the invention.

FIG. 1 shows a block diagram of a transceiver 1 as a zero intermediate frequency radio device according to the invention. The transceiver 1 comprises a receive branch Rx and a transmit branch Tx. In another embodiment in which no transmit branch Tx is present, the radio device is a receiver. The transmit branch Tx comprises a quadrature mixer having filters 2 and 3, mixers 4 and 5, and a summing device 6, and further a transmit power amplifier 7 coupled to the quadrature mixer. At input side, the quadrature mixer is coupled to a baseband circuit with a modulator (not shown in detail). At output side, the transmit power amplifier 7 is coupled to a Tx/Rx-switch 8. The Tx/Rx-switch 8 is coupled to an antenna 9. Such a transmit branch is well-known in the art. The receive branch Rx comprises a variable gain low noise radio frequency amplifier (LNA) 10 that is coupled to the Tx/Rx-switch 8. The LNA 10 amplifies an output signal $V_{sig}$ that corresponds to an incoming radio frequency signal RF that is received by the antenna 9. The radio frequency signal RF, received in channel 1 of the so-called 2.4 GHz band as defined in said IEEE 802.11b standard, for instance, exhibits a high dynamic range, typically 80 dB, from −90 dBm to −10 dBm. An output 11 of the LNA 10 is coupled to a frequency down converter 12 for down converting the radio frequency signal RF to a zero-IF signal $V_{in}$. Shown is a quadrature frequency down converter. The frequency down converter 12 comprises mixers 13 and 14 in respective quadrature and in-phase mixer paths that provide filtered and amplified quadrature signals Rx_Q and Rx_I. The frequency down converter 12 further comprises controllable AC-couplers 15, 16, 17, and 18, controllable channel filters 19, 20, 21, and 22, and zero-IF amplifiers 23 and 24. The AC-couplers 15 and 17 are coupled between the mixers 13 and 14 and the zero-IF amplifiers 23 and 24, respectively. The AC-couplers 16 and 18 are coupled between the channel filters 19 and 20, and between the channel filters 21 and 22, respectively. 25 is provided for controlling gains of the amplifiers 10, 23 and 25, and for controlling gains and other parameters of the channel filters 19, 20, 21, and 22. A signal $V_{out}$ is shown at an output of the AC-coupler 15. Control signals on the control bus 25 are provided by an AGC controller comprised of a signal processor 26 in a baseband circuit 27, of a state machine 28, and of an AGC bus controller 29. The signal or micro processor 26 comprises ROM and RAM (not shown in detail) for storing non-volatile program data, and for storing volatile data for use with the program data. The state machine 28 controls the AGC bus controller 29, and further provides cut-off frequency control signals to the AC-couplers 15, 16, 17, and 18. Once the functionality of the state machine has been defined, a person skilled in the art will have no difficulty in implementing the state machine, in the form of a so-called ASIC (Application Specific Integrated Circuit), for instance. In another embodiment in which signal processor has dedicated I/O-ports, the state machine 28 can be dispensed with. In such an embodiment, the programmed signal processor provides all necessary control signals. The baseband circuit 27 further comprises analog to digital converters 30 and 31 for sampling the quadrature signals Rx_I and Rx_Q. The sampled Rx_I and Rx_Q signals are supplied to a demodulator (not shown in detail here). The transceiver 1 further comprises a frequency synthesizer 32 comprising a PLL for generating local oscillator signals for the receive branch Rx and for the transmit branch Tx. As is well-known in the art, the PLL comprises a voltage controlled oscillator (VCO) 33 and a loop filter 34. A reference oscillator signal (not shown) is supplied to the PLL. In order to generate a 2412 MHz LO signal for ISM channel 1, the 1.2 GHz VCO signal is multiplied by two. For generating ninety degrees phase shifted LO signals that are fed to the mixers 13 and 14 in the receive branch Rx, and to the mixers 4 and 5 in the transmit branch, a 90 degrees phase shifter 35 is coupled to the multiplied by two VCO signal. The transceiver 1 further comprises a received signal strength indicator (RSSI) comprised of squarers 36 and 37, a summer 38, a low pass filter (LPF) 39, a logarithmic ampifier (LOG) 40, and an analog to digital converter 41. The sampled RSSI signal is supplied to the state machine 28 or to the signal processor 26, depending on the particular embodiment.

Figure 2:
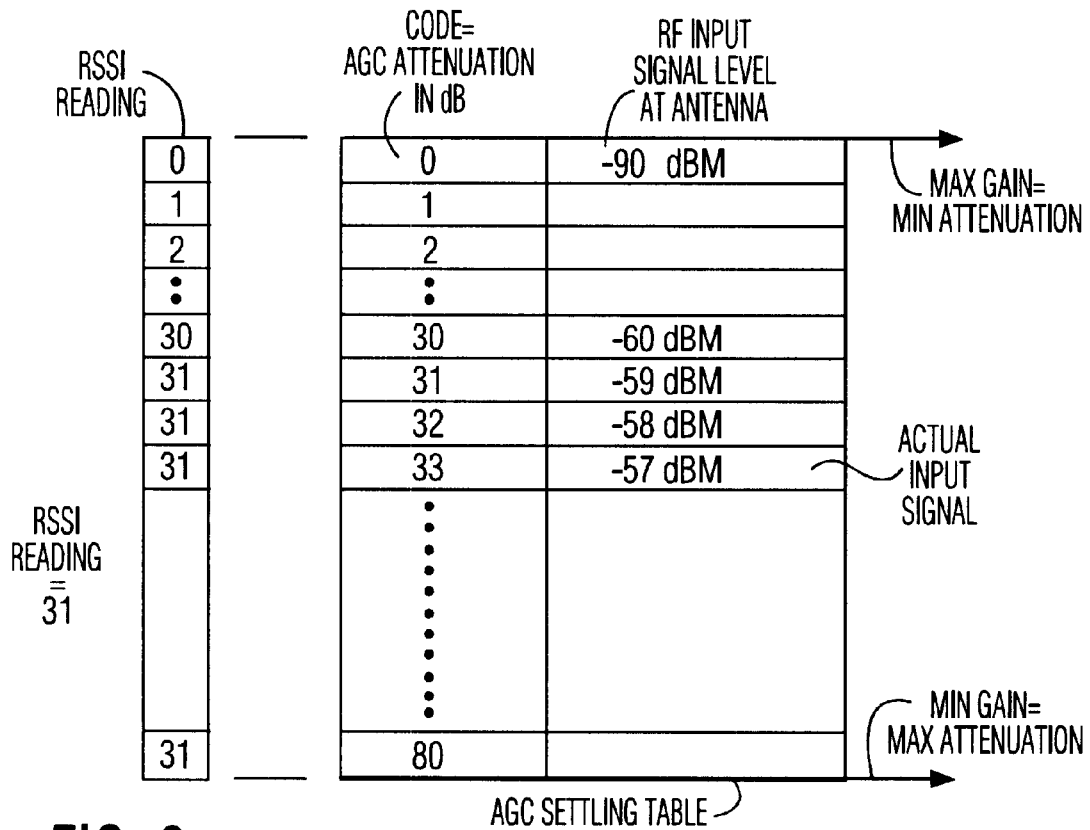
FIG. 2 shows an AGC settling table according to the invention, and a first step of gain setting.
Figure 3:
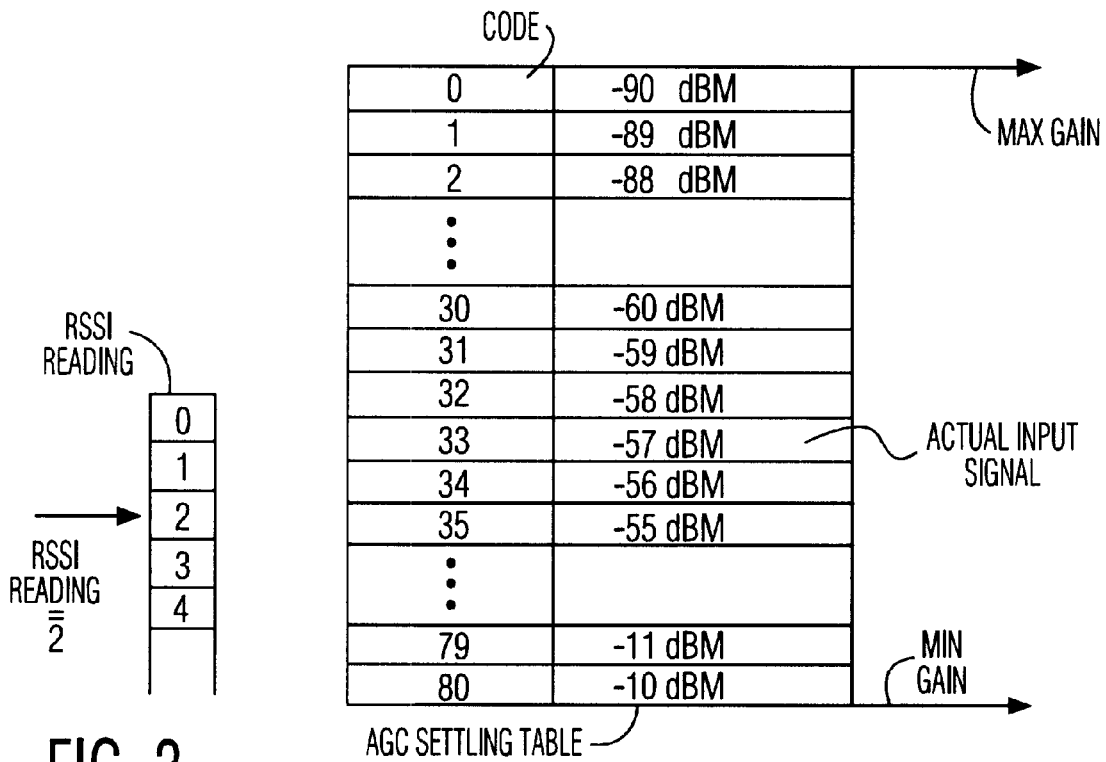
FIG. 3 shows an AGC settling table according to the invention, and a second step of gain setting.

FIG. 2 shows an AGC settling table according to the invention, and a first step of gain setting, and FIG. 3 shows the AGC settling table according to the invention, and a second step of gain setting.

After the receiver is switch on, the AGC should settle within 10 μsec. The state machine 28 and the signal processor 26, that form an AGC controller, are programmed to implement AGC settling in accordance with the invention. In a first embodiment, initially, the gain of the receive path Rx is set to maximum gain MAX_GAIN. In a second embodiment, initially, the gain of the receive path Rx is set to minimum gain MIN_GAIN. In the first embodiment, exhibiting a faster AGC settling time than the second embodiment, small amplitude radio signals are resolved first, at maximum gain. In the second embodiment, large amplitude radio signals are resolved first, at minimum gain. The first embodiment will now be described in detail. Initially, the AGC-code is set to zero. In the given example, the analog to digital converter 41 is a 5-bit converter, so at its output it produces a digital code between 0–31. It is assumed that the RSSI circuit operates linearly over a 32 dB input signal range (safe range) for a range of output digital codes 0–31. Outside such a 0–31 range, it is assumed that a reading of the analog to digital converter 41 is not a reliable representation of the actual received radio frequency signal RF. Therefore, only a part of the RF signal's dynamic range of 80 dB can be sampled. The AGC settling table 50 shows the required AGC attenuation versus RF input signal level, as an example. A reading of the RSSI is indicated with an arrow. Under these assumptions, at maximum gain, all readings corresponding to greater than 31 are rejected, and the AGC is not set. Too high a setting of the gain, at a low radio frequency signal strength, would, at only a small DC-offset in the Rx path, easily saturate signals in the Rx path. To avoid such a saturation, the AC-couplers 15, 16, 17, and 18 are provided. I.e., as indicated in the AGC table 50, initially, at maximum gain, only radio frequency signals between −90 dBm and −60 dBm can reliably be indicated by the RSSI. In the given example, radio frequency signals in the 80 dB dynamic signal range are coded 0–80. With such a coding, the AGC can be settled with an accuracy of 1 dB. Other mappings of codes to signals, with a different AGC settling accuracy, may be applied, as will be readily understood by a person skilled in the art. With a reading of code=15, for instance, at maximum gain, within a code range of 0–31, no saturation occurs. Then, the AGC can be set by reducing the gain in the Rx path with 15 dB, from maximum gain. When setting the gain in the Rx path to a particular gain value it is essential to wait until all DC-offset in the Rx path has been removed, in all stages thereof before actually using the I&Q output signals. Based on the assumption that the maximum DC-offset of each stage is known, depending on modifying a gain of a particular stage, a waiting time for the DC-offset to cancel is set. The largest DC-offset is to be expected due to LO-leakage from the VCO+frequency doubler to the input of the low noise radio frequency amplifier 11. Other stages, after the mixers 13 and 14, typically exhibit a lower DC-offset. A waiting time for DC-offset to at the input of the LNA 11 to cancel, is typically set 2–3 μsec. For other stages, a waiting time is typically set to 1 μsec. With a reading of code=31, at maximum gain, saturation occurs. Then, the AGC cannot be set and a further step is needed, similar to the above described step of gain setting and waiting for DC-offset to cancel. In the further step, from maximum gain, the gain in the Rx path is reduced by 31 dB. This means that in the further step, radio frequency signals can be indicated with a signal strength between −59 dBm and −29 dBm. In this further step, the AGC-code is set to 31. Also in this further step, it essential to wait until DC-offset due to a change in gain setting has been cancelled. With a reading of code=2, for instance, the AGC can still not be set, because, due to still too high a gain of the Rx path, the reading code=2 still saturates the Rx path at the I&Q A/D input. Then, a still further step is needed, similar to the above two steps. In a next step, the gain is reduced by 2 dB. In the given example, the actual input signal is −57 dBm. In the second embodiment, starting off at minimum gain, similar steps are performed, until the RSSI reading falls in a range of codes corresponding to the RSSI reading, and finally setting the RSSI to read zero.

Figure 4:
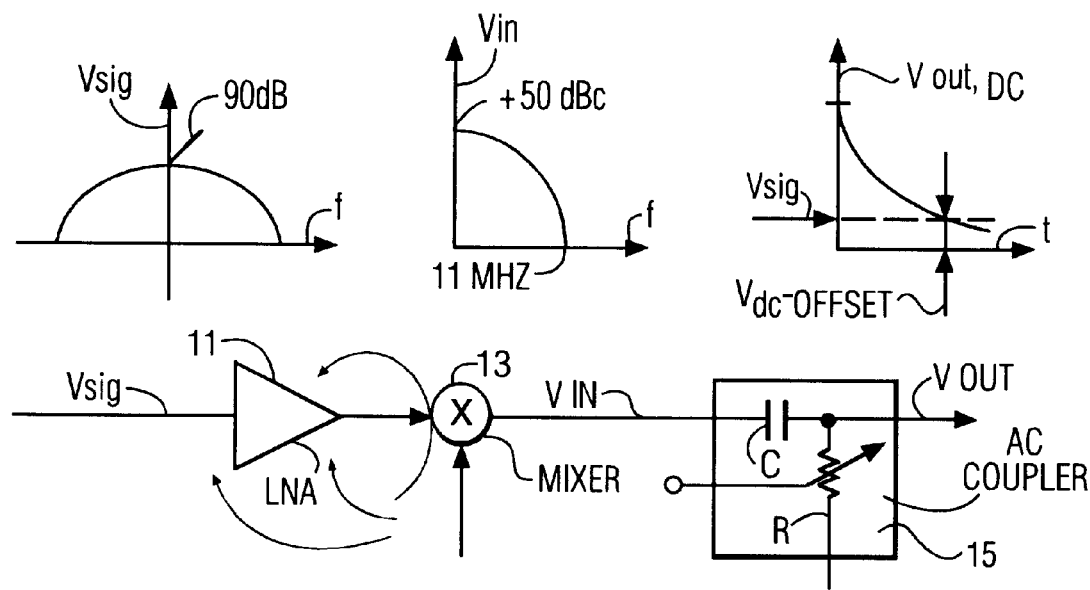
FIG. 4 shows LO-leakage that causes a DC-offset signal at an output of a mixer in the radio device, and an AC-coupler that is coupled to the output of the mixer.

FIG. 4 shows LO-leakage that causes a DC-offset signal at an output of the mixer 13 in the radio device 1, and the AC-coupler 15 that is coupled to the output of the mixer 13. Further shown are the frequency spectra of the signals $V_{sig}$ and $V_{in}$, and decay of the DC-offset $V_{out,\,DC}$ due to LO-leakage to the input of the LNA 11 as a function of time, at the output of the AC-coupler 15. In the example given, the gain of the LNA 11 can be set in two steps, to +20 dB or to 0 dB. For a 1 MHz cut-off frequency of the AC-coupler 15, at a gain change of the LNA 11 of 20 dB, initially a huge DC-offset is present due to a low leakage at the input of the LNA 11. The waiting time for the DC-offset to cancel is set such that waiting occurs until $V_{out,\,DC}$ is smaller than $V_{sig}/10$. At a cut-off frequency of 1 MHz, the waiting time is typically 3 μsec. Due to an initially relatively high cut-off frequency of the AC-coupler 15, a notch in its frequency spectrum occurs. Such a notch causes the RSSI to indicate an incorrect measurement of the radio frequency signal RF. It is thus advantageous to reduce the cut-off frequency of the AC-coupler 15, after the AGC has settled. Furthermore, the higher the cut-off frequency of the AC-coupler 15, the worse the signal-to-noise ratio. So, after AGC has settled, the cut-off frequency of the AC-coupler is reduced by reducing the time constant RC of the AC-coupler 15, as indicated. The resistor R can be varied continuously, or in steps.

Figure 5:
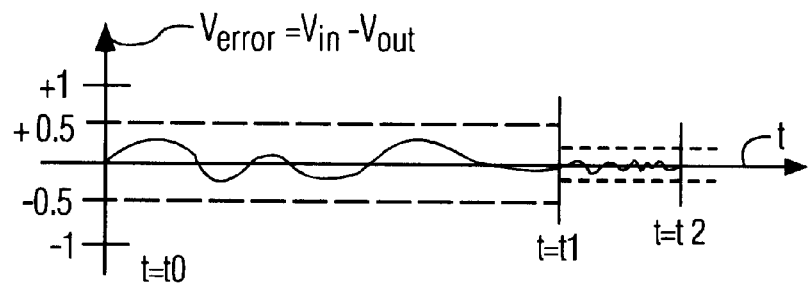
FIG. 5 shows an error signal at an output of the AC-coupler as a function of time.

FIG. 5 shows an error signal $V_{error}$ at an output of the AC-coupler 15 as a function of time t. At t=t0, the cut-off frequency of the AC-coupler 15, and also of the AC-coupler 16 is 1 MHz. At t=t1, when complete AGC gain has been set, the cut-off frequency is reduced to 100 kHz. Eventually, at t=t2, the cut-off frequency is further reduced to 10 kHz, effectively removing AC-coupling to a very large extent. This leads to a gradual reduction of the signal $V_{error}$ to lower than 10% of the signal $V_{in}$.

Figure 6:
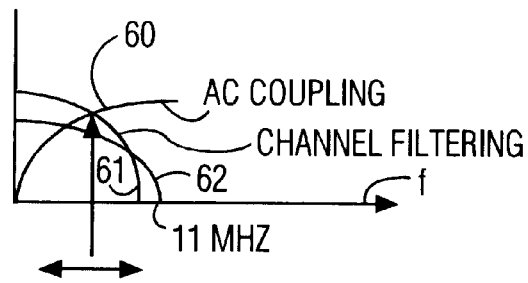
FIG. 6 shows AC-coupling and channel filtering of a zero intermediate frequency signal in a radio device.

FIG. 6 shows a frequency characteristic 60 of AC-coupling and a frequency characteristic 61 of channel filtering of a zero intermediate frequency signal in the radio device 1, and further a frequency spectrum 62 of the zero-IF signal at an output of the mixer 15.

After the AGC has set, it is advantageous to reduce the gain to a received signal strength indicator input by 10 dB, in order to detect both an increase or a decrease in signal level later on. Gain to the input of the received signal strength indicator can be reduced through controllable attenuators (not shown in detail here) coupled between the Rx_Q and Rx_I outputs and the squarers 36 and 37. The nominal set point for the RSSI will then be ten instead of zero, and will indicate signal changes of +10 dB to −22 dB, beyond which it will saturate.

Also, a larger range RSSI can be used for this purpose, e.g. a range of 42 dB. This will give a signal change reading of +10 dB to −32 dB. In this embodiment, readings between 0 and 31 will be used for AGC, whereas readings between −10 and −1 are used for the above purpose.

In the embodiments given, gain reduction, channel filtering, and reduction of cut-off frequencies can be distributed over many stages. When reducing gain of the Rx path, from maximum gain to a lower gain, it is advantageous to first reduce the gain of the LNA 11. Similarly, when increasing the gain of the Rx path, from minimum gain to a higher gain, it is advantageous to increase the gain of the LNA 11 in a last step. Such a gain setting mitigates the effects of out-of-band jammers or interferers in other channels of the ISM band. Furthermore, at a lower gain setting, the radio front end becomes more linear.

In view of the foregoing it will be evident to a person skilled in the art that various modifications may be made within the spirit and scope of the invention as hereinafter defined by the appended claims and that the invention is thus not limited to the examples provided. The word "comprising" does not exclude the presence of other elements or steps than those listed in a claim.

What is claimed is:

1. A zero intermediate frequency radio device comprising:
   an antenna for receiving a radio frequency signal, said radio frequency signal exhibiting a high dynamic range;
   a frequency down converter for down converting said radio frequency signal to a zero intermediate frequency signal, said frequency down converter comprising a mixer, an AC-coupler, and a received signal strength indicator with a signal resolving range that is below said high dynamic range, said AC-coupler being coupled to an output of said mixer;
   a signal processor for processing said zero intermediate frequency signal;
   at least one amplifier coupled between said antenna and said signal processor; and
   an automatic gain controller for at least gain controlling said at least one amplifier,
   said automatic gain controller being configured to set a gain of said at least one amplifier by setting said gain to a predetermined gain, by waiting a predetermined time for allowing DC-offset signals in said radio device to decay, by checking whether a reading of said received signal strength indicator is within said signal resolving range, and by setting said gain in accordance with said reading if said reading is within said signal resolving range.

2. A zero intermediate frequency radio device as claimed in claim 1, wherein said predetermined gain initially is at a maximum gain value of said gain, and said automatic gain controller is configured to stepwise decrease said gain, while repeatedly waiting said predetermined time and repeatedly performing said checking until said reading is within said signal resolving range.

3. A zero intermediate frequency radio device as claimed in claim 1, wherein said predetermined gain initially is at a minimum gain value of said gain, and said automatic gain controller is configured to stepwise increase said gain, while repeatedly waiting said predetermined time and repeatedly performing said checking until said reading is within said signal resolving range.

4. A zero intermediate frequency radio device as claimed in claim 2, wherein said at least one amplifier is comprised of a radio frequency amplifier coupled between said antenna and an input of said mixer, and of a zero intermediate frequency amplifier coupled between an output of said mixer and said signal processor, and said gain is a product of a first gain of said radio frequency amplifier and a second gain of said zero intermediate frequency amplifier, said automatic gain controller being configured to first modify said first gain when setting said gain.

5. A zero intermediate frequency radio device as claimed in claim 3, wherein said at least one amplifier is comprised of a radio frequency amplifier coupled between said antenna and an input of said mixer, and of a zero intermediate frequency amplifier coupled between an output of said mixer and said signal processor, and said gain is a product of a first gain of said radio frequency amplifier and a second gain of said zero intermediate frequency amplifier, said automatic gain controller being configured to last modify said first gain when setting said gain.

6. A zero intermediate frequency radio device as claimed in claim 4, wherein after modifying said first gain, said waiting said predetermined time is a first predetermined time.

7. A zero intermediate frequency radio device as claimed in claim 6, wherein said automatic gain controller is configured to modify said second gain, and said waiting said predetermined time is a second predetermined time, said second predetermined time being substantially shorter than said first predetermined time.

8. A zero intermediate frequency radio device as claimed in claim 1, wherein after settling of said gain, said automatic gain controller is configured to reduce a cut-off frequency of said AC-coupler.

9. A zero intermediate frequency radio device as claimed in claim 8, wherein said automatic gain controller is configured to reduce said cut-off frequency to such an extent that AC-coupling effectively becomes DC-coupling.

10. A zero intermediate frequency radio device as claimed in claim 1, wherein at an output side of said mixer said frequency down converter comprises a channel filter, and said automatic gain controller is configured to distribute gain control over said mixer, said AC-coupler, said at least one amplifier, and said channel filter.

11. A zero intermediate frequency radio device as claimed in claim 1, wherein said frequency down converter is a quadrature converter.

12. A zero intermediate frequency radio device as claimed in claim 1, further comprising a transmit branch and a receive-transmit switch, said antenna, said frequency down converter, and said transmit branch being coupled to said receive-transmit switch.

13. A zero intermediate frequency radio device as claimed in claim 1, wherein, after said automatic gain controller has set said gain, gain to an input of said received signal strength indicator is reduced by a predetermined amount in order to detect a decrease in signal level.

14. A gain control method for gain controlling of a zero intermediate frequency radio device, said zero intermediate radio device comprising an antenna for receiving a radio frequency signal, said radio frequency signal exhibiting a high dynamic range, a frequency down converter for down converting said radio frequency signal to a zero intermediate frequency signal, said frequency down converter comprising a mixer, at least one amplifier, and an AC-coupler, said AC-coupler being coupled to an output of said mixer, and said zero intermediate frequency radio device further comprising a received signal strength indicator with a signal resolving range that is below said high dynamic range, said method comprising at least setting a gain of said at least one amplifier by:
   setting said gain to a predetermined gain;
   waiting a predetermined time for allowing DC-offset signals in said radio device to decay;
   checking whether a reading of said received signal strength indicator is within said signal resolving range; and
   setting said gain in accordance with said reading if said reading is within said signal resolving range.

* * * * *